United States Patent
Shen et al.

(10) Patent No.: US 9,493,346 B2
(45) Date of Patent: Nov. 15, 2016

(54) CAPACITOR WITH PLANARIZED BONDING FOR CMOS-MEMS INTEGRATION

(71) Applicant: Taiwan Semiconductor Manufacturing Co., Ltd., Hsin-Chu (TW)

(72) Inventors: Wei-Cheng Shen, Tainan (TW); Yi-Hsien Chang, Shetou Township (TW); Yi Heng Tsai, Hsinchu (TW); Tzu-Heng Wu, New Taipei (TW); Chun-Ren Cheng, Hsin-Chu (TW); Chun-Wen Cheng, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 36 days.

(21) Appl. No.: 14/445,226

(22) Filed: Jul. 29, 2014

(65) Prior Publication Data
US 2016/0031704 A1 Feb. 4, 2016

(51) Int. Cl.
*B81C 1/00* (2006.01)
*B81B 7/00* (2006.01)

(52) U.S. Cl.
CPC .................. *B81C 1/00238* (2013.01)

(58) Field of Classification Search
None
See application file for complete search history.

(56) References Cited

U.S. PATENT DOCUMENTS

| 8,860,154 B2 * | 10/2014 | Wang ............. H04R 19/04 257/254 |
| 8,921,957 B1 * | 12/2014 | Zhang ............. H04R 1/04 257/416 |
| 2009/0041270 A1 * | 2/2009 | Schrank ............. H04R 19/04 381/174 |

(Continued)

OTHER PUBLICATIONS

Cooper, Ken, "Enabling next generation MEMS devices with metal Eutectic Bonding", downloaded from URL <http://electroiq.com/blog/2008/09/enabling-next-generation-mems-devices-with-metal-eutectic-bonding/> on Nov. 4, 2015.*

(Continued)

*Primary Examiner* — Joseph Schoenholtz
(74) *Attorney, Agent, or Firm* — Eschweiler & Associates, LLC

(57) ABSTRACT

An integrated circuit (IC) structure is provided. The IC structure includes an IC substrate including active devices which are coupled together through a conductive interconnect structure arranged thereover. The conductive interconnect structure includes a series of horizontal conductive layers and dielectric regions arranged between neighboring horizontal conductive layers. The conductive interconnect structure includes an uppermost conductive horizontal region with a planar top surface region. A MEMS substrate is arranged over the IC substrate and includes a flexible or moveable structure that flexes or moves commensurate with a force applied to the flexible or moveable structure. The active devices of the IC substrate are arranged to establish analysis circuitry to facilitate electrical measurement of a capacitance between the uppermost conductive horizontal region and the flexible or moveable structure.

21 Claims, 15 Drawing Sheets

(56) References Cited

U.S. PATENT DOCUMENTS

| | | | |
|---|---|---|---|
| 2012/0098105 A1* | 4/2012 | Adkisson | H01L 23/562 257/620 |
| 2013/0334626 A1* | 12/2013 | Weber | B81B 3/0018 257/416 |
| 2014/0239353 A1* | 8/2014 | Daneman | B81C 1/00158 257/254 |
| 2015/0060954 A1* | 3/2015 | Cheng | B81C 1/00238 257/254 |
| 2015/0102390 A1* | 4/2015 | Liu | H01L 27/092 257/254 |
| 2015/0266723 A1* | 9/2015 | Chan | H04R 1/08 381/173 |

OTHER PUBLICATIONS

Lee, Sungsik, et. al., "1.5V Sub-mW CMOS Interface Circuit for Capacitive Sensor Applications in Ubiquitous Sensor Networks", ETRI Journal, vol. 30, No. 5 Oct. 2008 pp. 644-552.*

* cited by examiner

CAPACITOR WITH PLANARIZED BONDING FOR CMOS-MEMS INTEGRATION

BACKGROUND

Microelectromechanical system (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
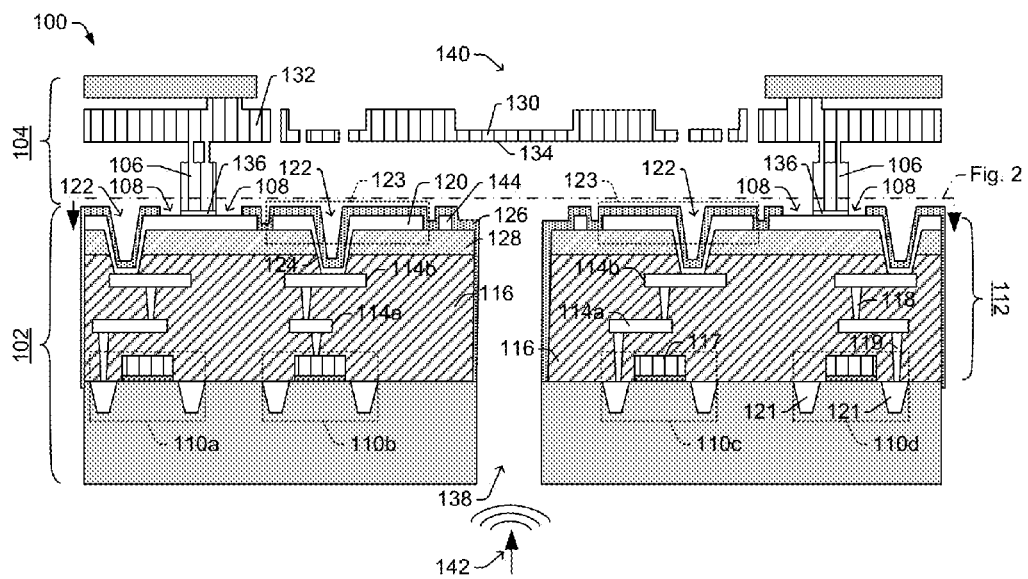
FIG. 1 illustrates a cross-sectional view of some embodiments of an integrated circuit (IC) structure including a microelectromechanical systems (MEMS) substrate bonded to the IC substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Moreover, "first", "second", "third", etc. are merely generic identifiers that do not imply temporal or spatial relationships between the various elements.

Modern day electronic devices are increasingly incorporating microelectromechanical systems (MEMS) devices. Many of these MEMS devices utilize two or more electrodes which are separated by a variable distance which changes as a function of a condition to be measured by the MEMS device. For example, the variable distance between the electrodes can change in proportion to a pressure or acceleration experienced by the MEMS device. One such type of MEMS device, a pressure sensor, includes a flexible membrane with a predetermined reference pressure on one side of the membrane and an ambient pressure on the other side of the membrane. A first electrode corresponds to or is affixed to the flexible membrane, while the a second electrode is located at a stationary reference frame with regards to the membrane—for example, on the substrate on which the MEMS device is built or on an anchor structure supporting the membrane. Thus, assuming the reference pressure is steady, the flexible membrane deflects in proportion to the difference between the ambient pressure and the reference pressure, such that the distance between the electrodes changes in proportion to the ambient pressure at any given time. In another type of MEMS device, a motion sensor—such as an accelerometer or a gyroscope, for example—includes a moveable proof mass that is mounted to an anchor structure via micromechanical springs. Thus, when the motion sensor experiences an acceleration, the springs extend (or compress) to increase (or decrease) a distance between the proof mass and anchor (or surrounding substrate). This again changes a distance between electrodes of the MEMS device. Whichever type of MEMS device is used, analysis circuitry can determine the distance between the electrodes by measuring a capacitance between the electrodes at a given time. In this way, pressure, acceleration, and/or other conditions can be measured by the MEMS device through this capacitive sensing.

A challenge with such MEMS devices is how best to accurately determine the initial spacing between the first (e.g., fixed) electrode and second (e.g., flexible or moveable) electrode. In particular, conventional MEMS devices have a large number of layers between their electrodes. Even though modern semiconductor processes have tightly controlled tolerances, each additional layer tends to add an additional amount of uncertainty into the thickness of the capacitor dielectric between the first and second electrodes. Thus, if one of these electrodes is "buried" under a large number of layers (each having some thickness uncertainty), the resultant capacitance for the final MEMS structure is in some situations not known with as much precision as designers would like, due to the small uncertain contributions from each of these number of layers. Therefore, the present disclosure provides techniques that limit the number of layers present between the electrodes to help reduce dielectric constant uncertainty. This helps to produce MEMS structures which exhibit more precise capacitances, which correspondingly allow more precise measurements by the MEMS devices. Thus, MEMS devices in accordance with this disclosure can provide end users with more accurate pressure measurements, acceleration measurements, velocity measurements, and the like.

Figure 2:
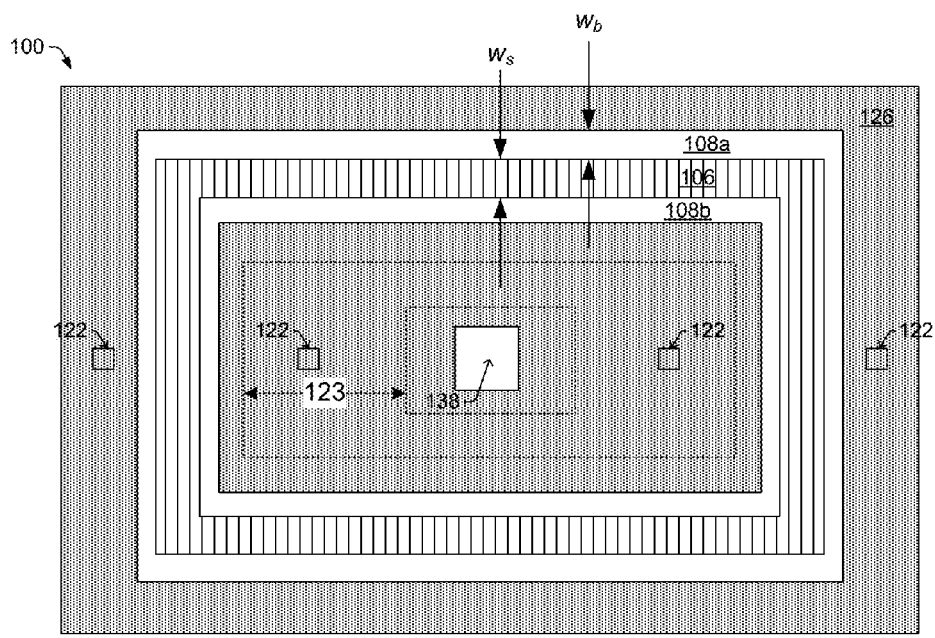
FIG. 2 illustrates a top view of some embodiments of the IC structure of FIG. 1.

FIG. 1 and FIG. 2 illustrate a cross-sectional view and top view, respectively, for an integrated circuit (IC) structure 100 in accordance with some embodiments. The IC structure 100 includes an IC substrate 102 and a MEMS substrate 104, which are coupled together by a conductive standoff member 106 fashioned on the MEMS substrate 104. The standoff member 106 is bonded to a conductive bonding ring region 108 on the IC substrate 102. A fusion bond or a eutectic bond can be used to couple the standoff member 106 to the bonding ring region 108.

The IC substrate 102 includes active devices, e.g., MOSFETS 110a-110d, which are coupled together through a conductive interconnect structure 112 arranged thereover. The conductive interconnect structure 112 includes a series of horizontal conductive layers, e.g., 114a, 114b, as well as dielectric regions 116 arranged between neighboring horizontal conductive layers. For example, the illustrated interconnect structure includes two horizontal conductive layers 114a, 114b (which can correspond to metal 1 and metal 2 layers, respectively) and which are operably coupled by vias 118, but any number of such horizontal conductive layers 114 can be stacked over one another. Often, the horizontal conductive layers 114, vias 118, and/or contacts 119 are made of copper or copper alloys, such as copper aluminum, but can also be made of other conductive materials, such as doped polysilicon, aluminum, nickel, tungsten, gold, platinum, silver, other metals, and/or other conductive materials. The dielectric regions 116 are often made of a high-k dielectric, but can also be made of other dielectric materials, such as silicon dioxide (SiO2). It will be appreciated that the illustrate contact coupling is merely an example and the contacts 119 could also be coupled to source/drain regions 121 or gate electrodes or other devices/structures in other configurations in other embodiments.

The IC substrate 102 includes an uppermost conductive horizontal region 120. As will be appreciated in more detail below, a planar top surface region 123 of the uppermost conductive horizontal region 120 can act as a sensing electrode for MEMS device on MEMS substrate 104. Recessed contact areas 122, which have angled sidewalls that are often non-perpendicular with regards to the planar top surface, are also present. A conformal layer of conductive material 124 may extend downward along the sidewalls of the recessed contact areas 124 to put the uppermost conductive horizontal region 120 in electrical contact with an underlying horizontal conductive layer 114b.

A vapor hydrofluoric acid (VHF) barrier 126 extends downward along the angled sidewalls of the recessed contact areas 122. In some embodiments, VHF barrier layer 126 is made of aluminum oxide (AlO$_2$) and is formed by atomic layer deposition (ALD), silicon-rich nitride formed by plasma enhanced chemical vapor deposition (PECVD), titanium tungsten (TiW) formed by PECVD, or amorphous silicon, for example. An opening in the VHF barrier exposes the bonding ring region 108 within the uppermost conductive horizontal region 120. A passivation layer 128, such as an SiN layer, is arranged between the uppermost conductive layer 120 and the underlying horizontal conductive layer 114b and protects the IC substrate 102 from moisture and/or other environmental contaminants.

The MEMS substrate 104 is arranged over the IC substrate 102 and includes a conductive membrane 130, which is one example of a flexible or moveable structure and which can be made of doped polysilicon in some embodiments. The conductive membrane 130 flexes or moves commensurate with a force applied thereto. The conductive membrane 130 is supported by a conductive cantilever support structure 132 and the conductive standoff member 106, which protrudes outwardly beyond a substantially planar surface 134 on the MEMS substrate 104. In some embodiments, a eutectic bonding layer 136, such as a germanium layer, is sandwiched between the conductive standoff member 106 and the bonding ring 108. In some embodiments, the standoff member 106 can have a standoff width, $w_s$, ranging from approximately 30 μm to 70 μm, while the bonding ring on either side of the standoff member can have a bond ring width, $w_b$, ranging from approximately 8 μm to approximately 10 μm. Bumps 144 can be present to prevent membrane stiction when the conductive membrane 130 is vibrated with large deformation.

In the embodiment of FIG. 1, an IC opening 138, which is aligned with the conductive membrane 130, extends vertically through the IC substrate 102 and puts an ambient environment in fluid communication with a lower side of the conductive membrane 130. A MEMS opening 140 can also extend at least partially through the MEMS substrate 104 and puts the ambient environment in fluid communication with an upper side of the conductive membrane 130.

In FIG. 1, the active devices 110 on the IC substrate 102 are arranged to establish analysis circuitry to facilitate electrical measurement of a capacitance between the uppermost conductive horizontal region 123 and the conductive membrane 130. For example, in some embodiments, the IC structure 100 can act as a microphone that converts sound into an electrical signal, although other applications are also possible. During microphone operation, sound in the form of a time-varying pressure wave (e.g., 142) can pass through IC opening 138 and strike the conductive membrane 130, thereby causing small displacements in the conductive membrane 130 relative to sensing electrode 123. The magnitude and frequency of these displacements correspond to the volume and pitch of an impingent sound wave. To convert these displacements into an electrical signal, analysis circuitry on IC substrate 102 measures the time-varying capacitance between the conductive membrane 130 and the uppermost conductive horizontal region 123. For example, the analysis circuitry can supply a predetermined charge to the conductive membrane 130 in time, and monitor how a voltage changes between the conductive membrane 130 and uppermost metal layer 120 as a function of the charge. By taking regular current and voltage measurements, the analysis circuit can track the capacitance according to the voltage/current relationship:

$$I(t) = C\frac{dV(t)}{dt}$$

where C is the capacitance. Because the time-varying capacitance reflects the time-varying distance between the conductive membrane 130 and uppermost conductive horizontal region 123 (and this distance changes in time based on the impingent sound wave), the analysis circuit can thereby provide an electrical signal representative of sound impingent on the conductive membrane 130.

The capacitance between the electrodes 123, 130 can be calculated according to the following expression:

$$C = \epsilon_0 \epsilon_r * A/d$$

wherein $\epsilon_o$ is the permittivity of the passivation layer 128; $\epsilon_r$ is the relative permittivity of air; A is the surface area of the sensing electrode 123; and d is the distance separating the sensing electrode 123 from the conductive membrane 130. In some embodiments, A is approximately $1.6 \times 10^{-1}$ meter, $\in_o$ ranges from approximately 2 to approximately 200; and d is approximately 8 µm, which results in the capacitor having an initial capacitance of approximately $1.7 \times 10-7$ F/m. Of course, as the conductive membrane 130 flexes in response to changing ambient pressure, the measured capacitance will change, thereby allowing an updated distance d to be determined, which can correspond to pressure, acceleration, and/or the like.

To provide end customers with a streamlined solution, in some embodiments, the IC substrate 102 can further include circuitry for processing the electrical signal. For example, in embodiments wherein the IC structure implements a microphone, the IC substrate 102 can include an analog-to-digital converter (ADC), and/or analog or digital acoustic filters for removing noise from the signals, and/or other signal processing circuitry.

Figure 3:
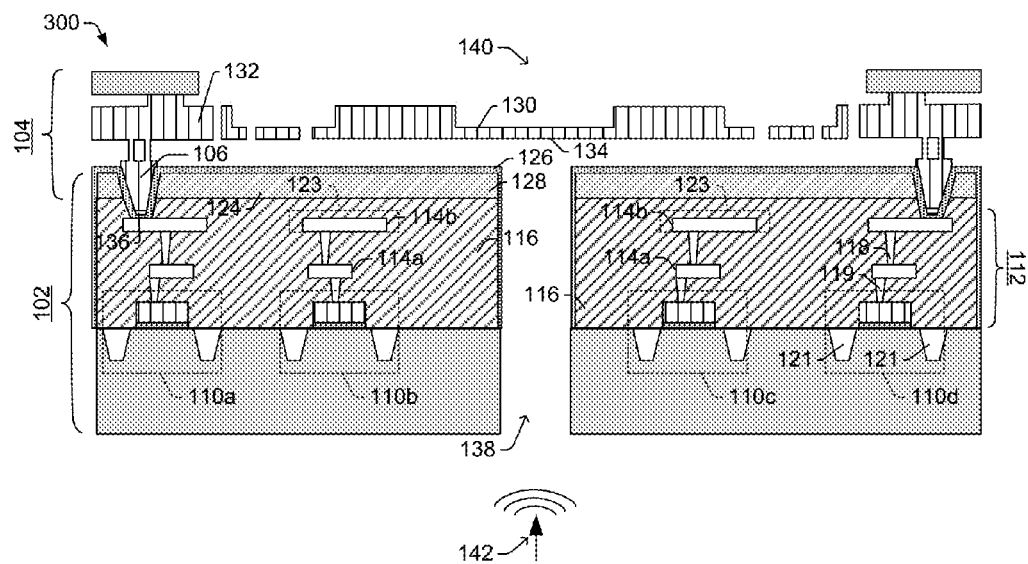
FIG. 3 illustrates a cross-sectional view of some other embodiments of an integrated circuit (IC) structure according to aspects of the present disclosure.

Advantageously, by arranging the sensing electrode 123 to correspond to the uppermost conductive layer 120, the number of layers present between the capacitor electrodes is reduced compared to other approaches. For example, FIG. 3 shows another IC structure 300 where an underlying horizontal conductive layer 114b corresponds to the lower capacitor electrode. However, in this other solution of FIG. 3, the distance between the upper and lower capacitor electrodes includes several additional layers between the electrodes, including SiN layer 128 and part of dielectric 116. As the thicknesses of these additional layers can have some uncertainty, the resulting capacitor dielectric in these other approaches can have a larger die to die variance (or even a larger device to device variance on a single die). Thus, by arranging the lower capacitor electrode to correspond to the uppermost metal layer 120 as shown in FIG. 1 (e.g., where the uppermost conductive horizontal region 120 is separated from the ambient environment solely by the VHF-barrier 126), the dielectric thickness and corresponding capacitance value for the MEMS device is set in a precise manner. Thus, the capacitance of individual capacitors, and matching between neighboring capacitors on a single IC structure, are improved, relative to other approaches.

Figure 4:
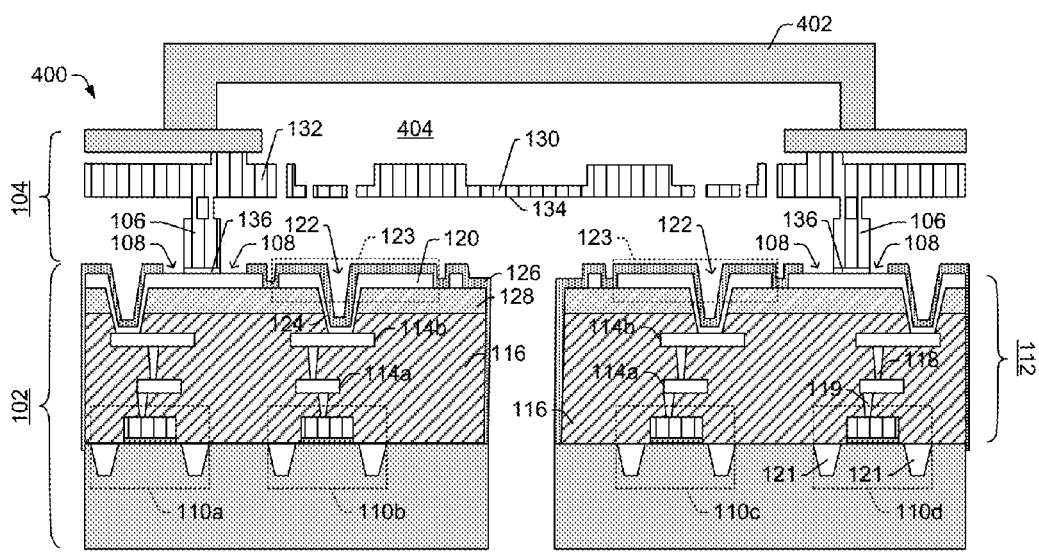
FIG. 4 illustrates a cross-sectional view of some other embodiments of an integrated circuit (IC) structure according to aspects of the present disclosure.

It will be appreciated that this disclosure is not limited to MEMS structures in the form of a microphone, but rather is applicable to a wide array of MEMS devices. For example, FIG. 4 shows another IC structure 400 that includes a cap structure 402. This cap structure 402 together with the MEMS substrate 104 collectively enclose a cavity 404 which stores a reference amount of gas. This stored gas in cavity 404 thus represents a reference pressure which is relatively steady, but which of course can vary according approximately to the ideal gas law, and which serves as an objective point of reference to measure the ambient pressure which exerts for on a lower side of conductive membrane 130.

In still other embodiments, rather than the conductive membrane being a conductive membrane that is non-permeable for ambient gas for retention of pressure, the MEMS device can take the form of an accelerometer or gyroscope, which utilizes a movable structure, such as a proof mass that is moveable via springs relative to a relatively fixed body of the MEMS substrate. Often, this moveable structure includes one or more holes to help a release etch free the moveable structure from surrounding regions of substrate during manufacture.

Figure 5:
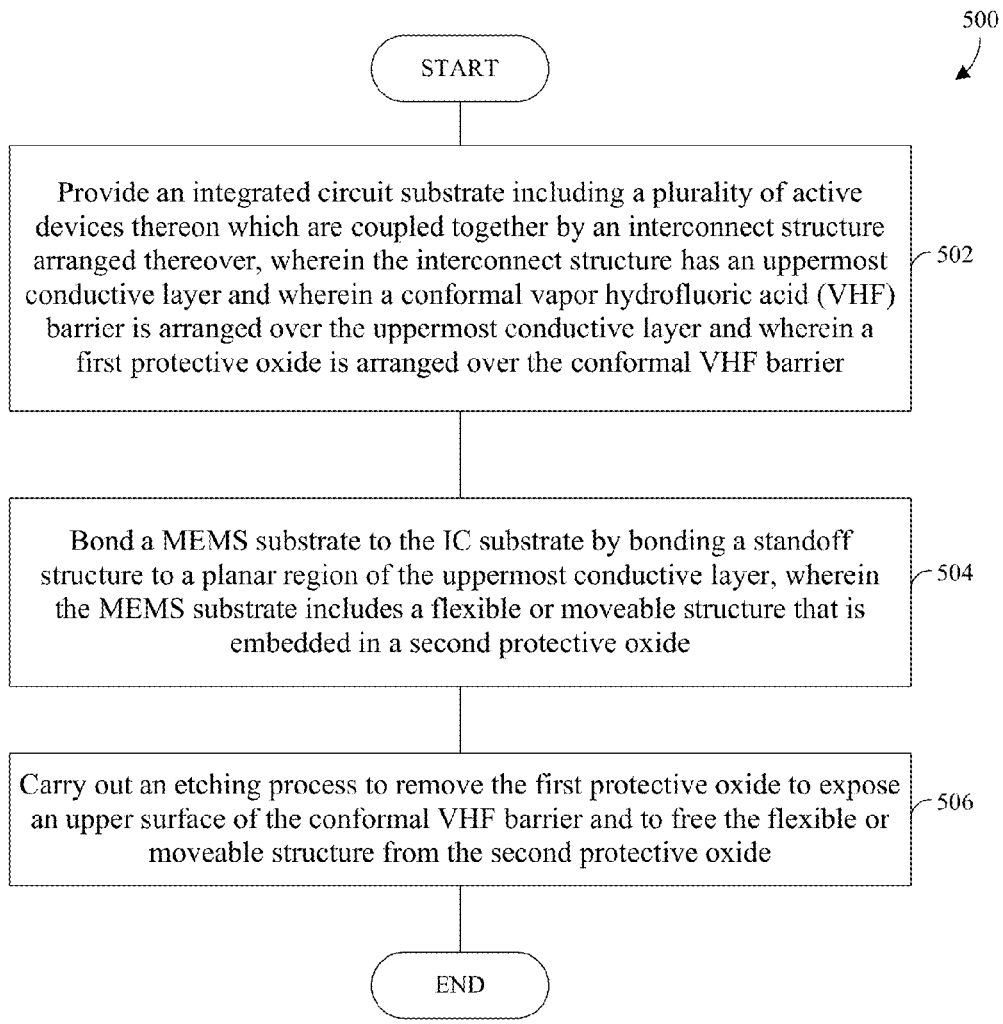
FIG. 5 illustrates a flow chart of some embodiments of a method of manufacturing an IC structure including according to aspects of the present disclosure.

With reference to FIG. 5, a flow chart 500 provides some embodiments of a method for manufacturing an IC structure according to aspects of the present disclosure. While the disclosed methods (e.g., the method described by the flowchart 500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

According to the method 500, an IC substrate is provided (Action 502). The IC substrate is, for example, a bulk silicon wafer, a silicon-on-insulator wafer, sapphire wafer, glass wafer, or some other type of wafer. In addition to silicon, the IC substrate can also include binary semiconductor materials, tertiary semiconductor materials, or higher order materials; as well as dielectric materials, metals, organic materials, and the like. The IC substrate includes a plurality of active devices which are coupled together by an interconnect structure arranged thereover. The interconnect structure has an uppermost conductive layer. A conformal vapor hydrofluoric acid (VHF) barrier is arranged over the uppermost conductive layer, and a first protective oxide is arranged over the conformal VHF barrier.

At Action 504, A MEMS substrate, which includes a flexible or moveable structure that is embedded in a second protective oxide, is bonded to the IC substrate by eutectic bonding or by fusion bonding. In some embodiments, eutectic bonding can be achieved by bonding a standoff member to a planar region of the uppermost conductive layer.

At Action 506, an etching process is carried out. This etching process removes the first protective oxide to expose an upper surface of the conformal VHF barrier and also frees the flexible or moveable structure from the second protective oxide.

Advantageously, because MEMS structure of the resulting IC structure has an electrode corresponding to the uppermost conductive layer, the resulting IC structure tends to have a more precise capacitance than some other MEMS structures.

FIGS. 6-29 collectively illustrate a more detailed manufacturing method in accordance with some embodiments. Generally speaking, FIGS. 6-11 depict acts for manufacturing a IC substrate, FIGS. 12-23 depict acts for manufacturing a MEMS substrate, and FIGS. 24-29 depict acts for bonding the IC substrate to the MEMS substrate and processing those substrates while bonded.

Figure 6:
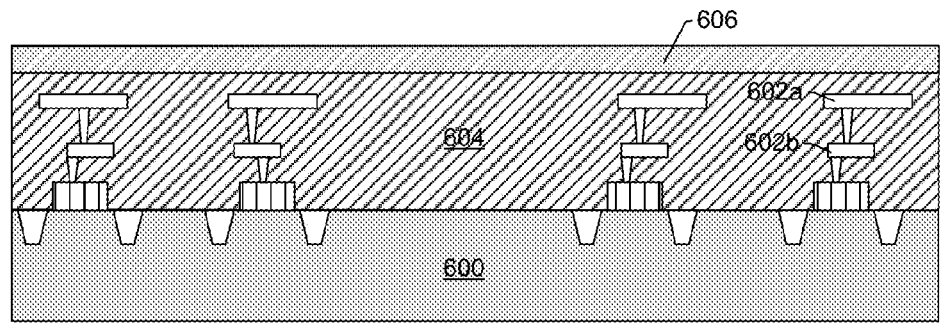
FIGS. 6-31 illustrate a series of cross-sectional views that collectively depict a method of manufacturing an integrated circuit structure according to aspects of the present disclosure.

FIG. 6 illustrates an IC substrate 600, which includes active device features and an uppermost metal layer 602a, such as a copper and/or aluminum layer. For simplicity, only MOSFET device features are illustrated in FIG. 6, however, it will be appreciated that any type of devices (e.g., FinFETs, BJTs, diodes, or JFETS) can be formed in the IC substrate 600. A series of metal layers 602a, 602b operably couple the devices according to a predetermined circuit configuration, and a dielectric layer 604 is arranged over the metal layers. A passivation layer 606, such as an SiN layer which can protect the CMOS devices from environmental conditions, can be over the uppermost metal layer 602a.

Figure 7:
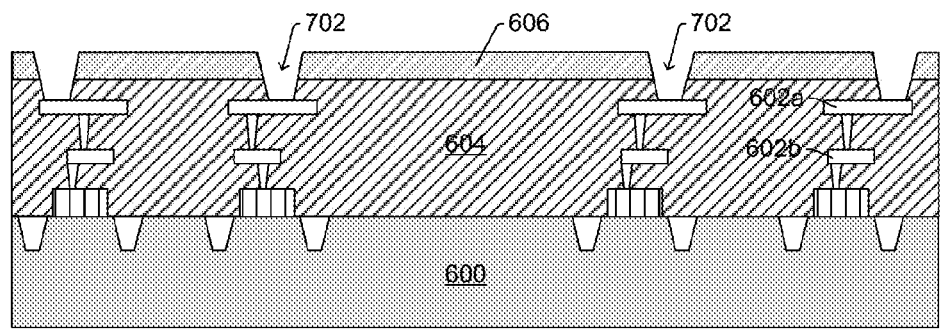

In FIG. 7, a patterning step is performed to form a first mask (not shown) over the passivation layer 606, and a first etch is performed while the first mask is in place to form openings 702 through which select portions of the upper conductive layer 602a are exposed. In this way, recessed contact areas are formed. In some embodiments, the recessed contact areas can have u-shaped or v-shaped cross-sections, with sidewalls that are non-perpendicular to a planar upper surface of passivation layer 606.

Figure 8:
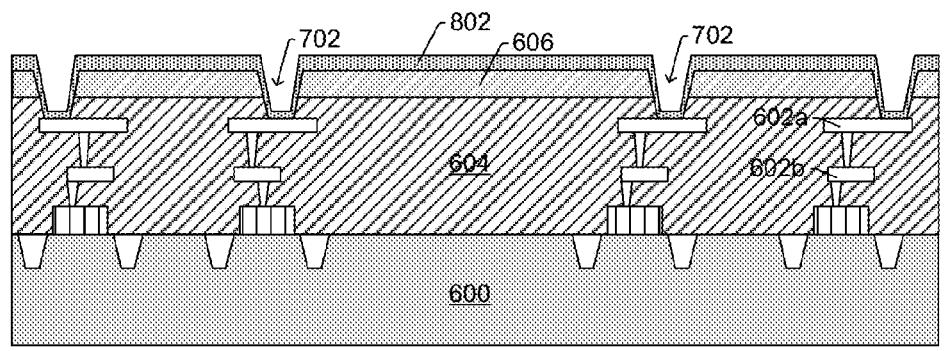

In FIG. 8, an uppermost conductive layer 802 is formed. In particular, the uppermost conductive layer 802, which can be made of aluminum copper (AlCu) in some embodiments, is a conformal layer which extends over the passivation layer 606 and along sidewalls of the openings 702 so as to be in electrical contact with the upper conductive layer 602a.

Figure 9:
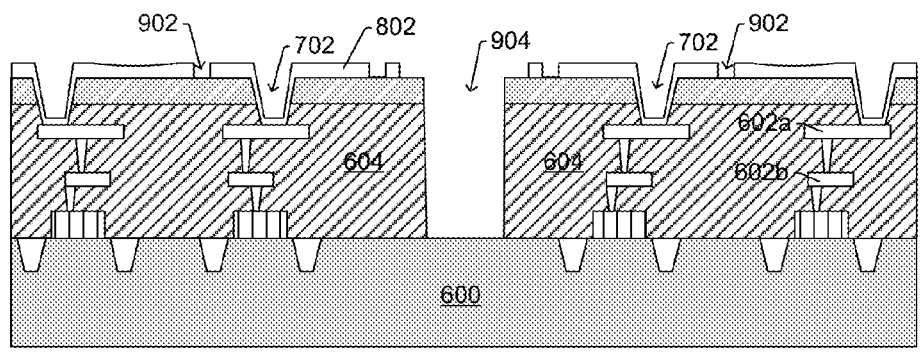

In FIG. 9 a second patterned mask (not shown) is formed over the uppermost conductive layer 802, and a second etch is carried out to remove exposed portions of the uppermost conductive layer and thereby form openings 902. This second etch typically stops on the passivation layer 606. A third patterned mask (not shown) is then formed, and a third etch is carried out with this third mask in place to form a deep recess 904 in the IC substrate.

Figure 10:
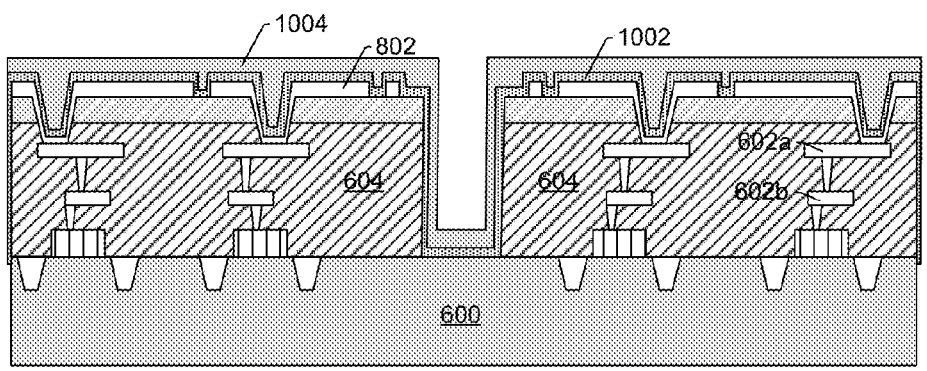

In FIG. 10, a conformal VHF-barrier layer 1002 is formed over the structure, and a protective oxide layer 1004 is then formed over the VHF barrier layer 1002.

Figure 11:
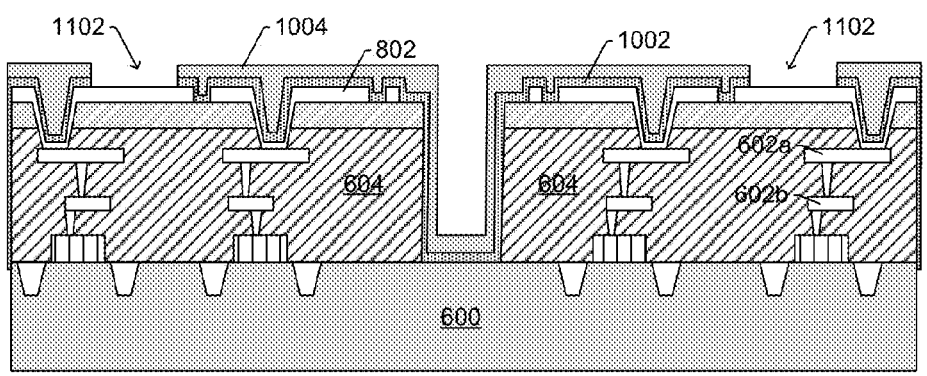

In FIG. 11, a fifth mask which can be referred to as a bonding ring mask (not shown) is then patterned over the protective oxide layer 1004, and a fifth etch is carried out with the bond ring mask in place to expose an upper surface of uppermost conductive layer (1102).

Figure 12:
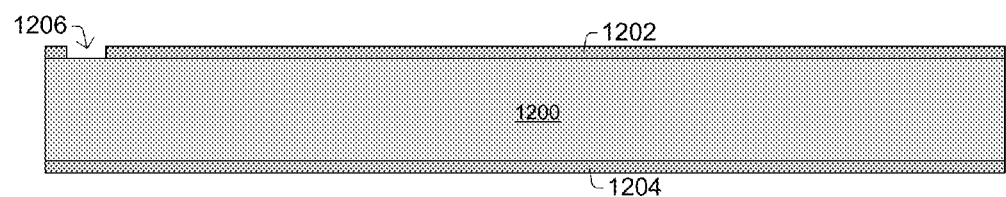

FIG. 12 illustrates a MEMS wafer 1200, which can be a bulk silicon substrate or an SOI substrate in some embodiments. Protective oxide layers 1202, 1204 are present on the opposing faces of the wafer, and an alignment feature 1206 is formed.

Figure 13:
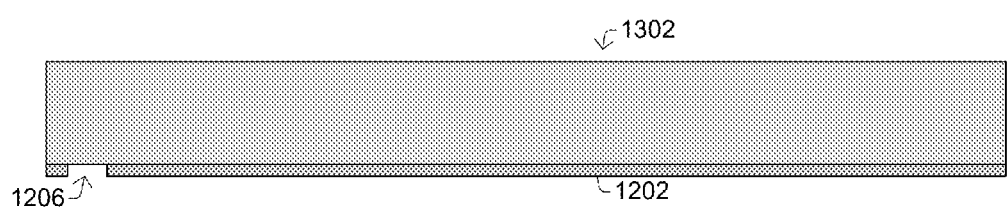
Figure 14:
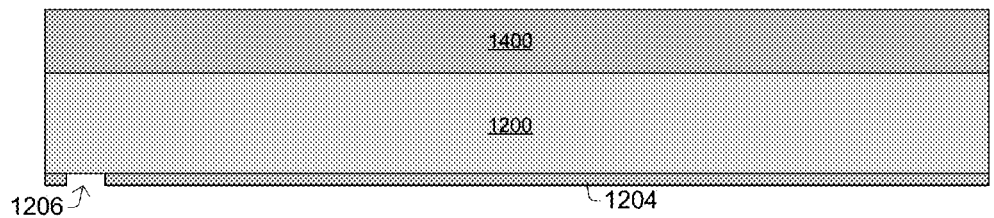

In FIG. 13, the MEMS wafer 1200 has been flipped over, and the protective oxide 1204 has been removed. In FIG. 14, a thick oxide 1400 is formed over the second face. After the oxide 1400 has been formed, it can be chemically mechanically polished (CMPed), so approximately 1 micron of oxide remains on the second face of the MEMS wafer.

Figure 15:
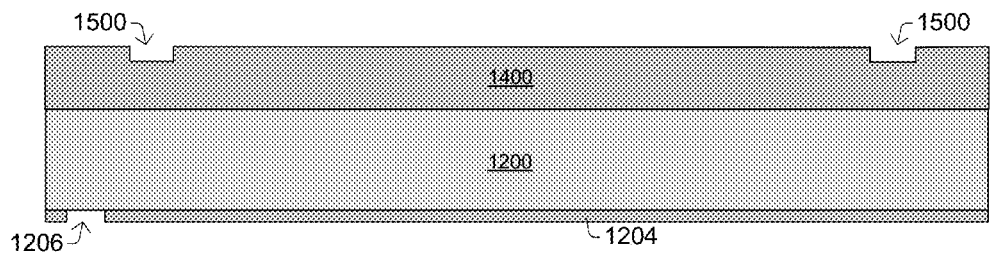

In FIG. 15, a mask (not shown) is patterned over the frame oxide layer 1400 using photolithography techniques, and an etch is carried out to form a series of frame recesses 1500. These recesses 1500 define spaces where polysilicon anchors are to be formed.

Figure 16:
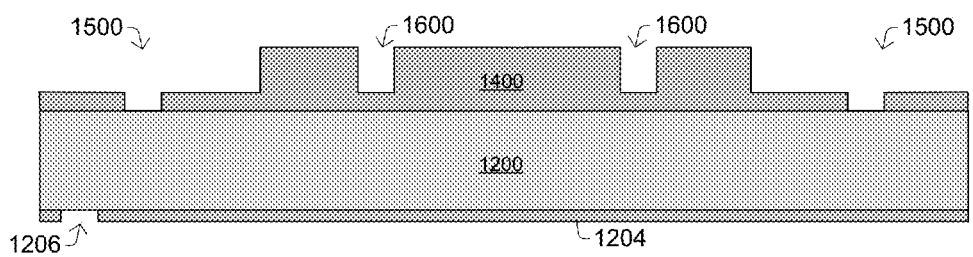

In FIG. 16, another patterning step is carried out, and additional recesses 1600 are etched through the frame oxide 1500 near step-regions of the silicon wafer. These additional recesses 1600 will be used to define MEMS conductive membrane.

Figure 17:
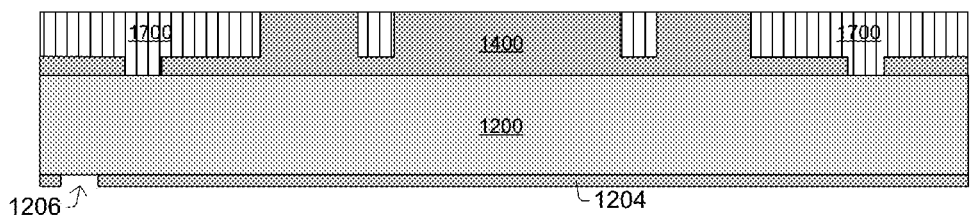

In FIG. 17, a thick polysilicon layer 1700 is deposited on the second face of the MEMS wafer, and is then CMPed back. In this way, polysilicon anchors are formed over the contact holes.

Figure 18:
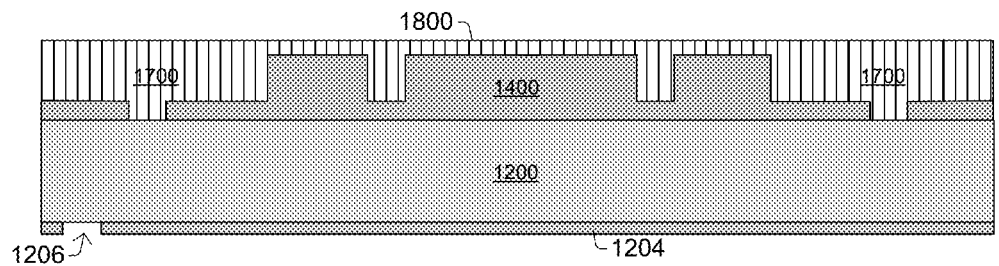

In FIG. 18, a thin layer of polysilicon 1800 is deposited over the second face of the wafer. After being subsequently patterned, this thin layer of polysilicon 1800 will act as the conductive membrane that constitutes a capacitive electrode of the MEMs device.

Figure 19:
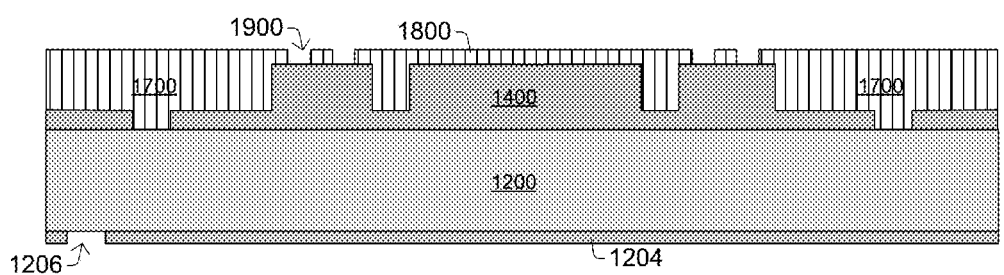

In FIG. 19, another patterning step is carried out, and holes or narrow trenches 1900 are etched to form a gap feature to pattern a conductive membrane.

Figure 20:
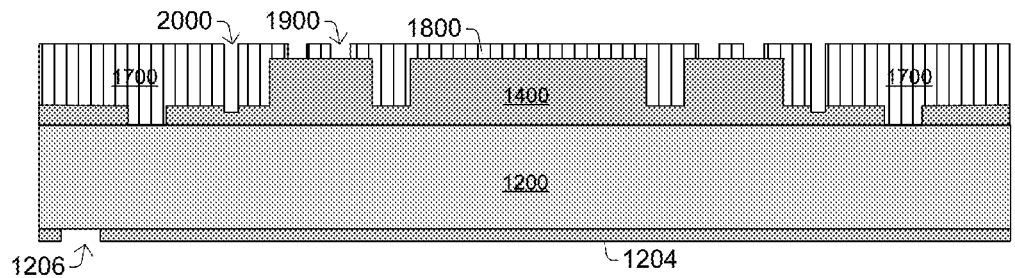

In FIG. 20, another patterning step is carried out, and holes 2000 are formed to define the anchor structures.

Figure 21:
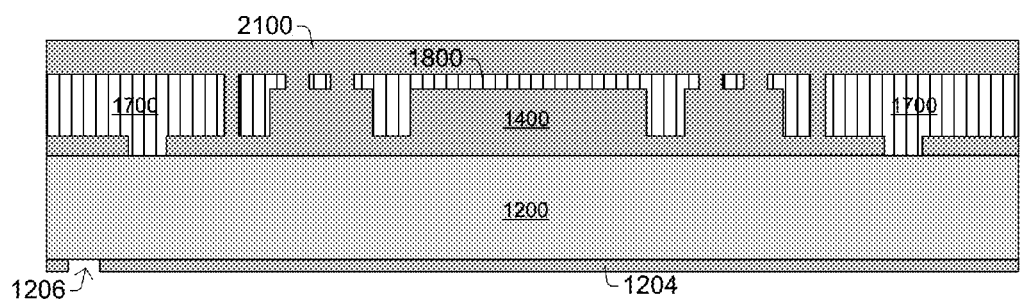

In FIG. 21, another oxide layer 2100 is formed over the conductive membrane 2100, and CMP is carried out. After CMP, the oxide layer 2100 has a predetermined thickness for dielectric gap control.

Figure 22:
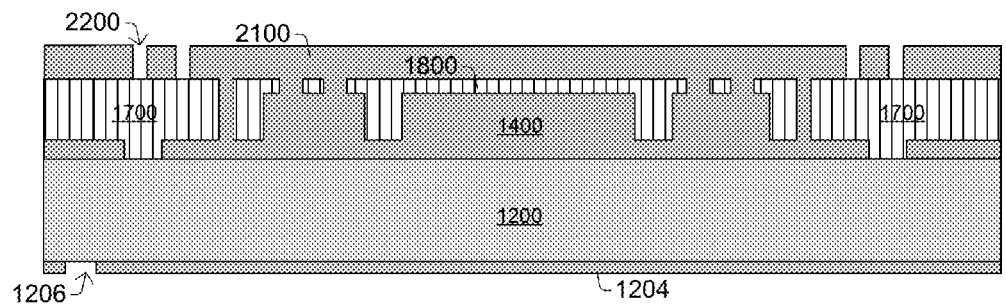

In FIG. 22, vias 2200 are formed through the oxide layer 2100 so as to extend down to an upper region of the polysilicon anchor regions 1700.

Figure 23:
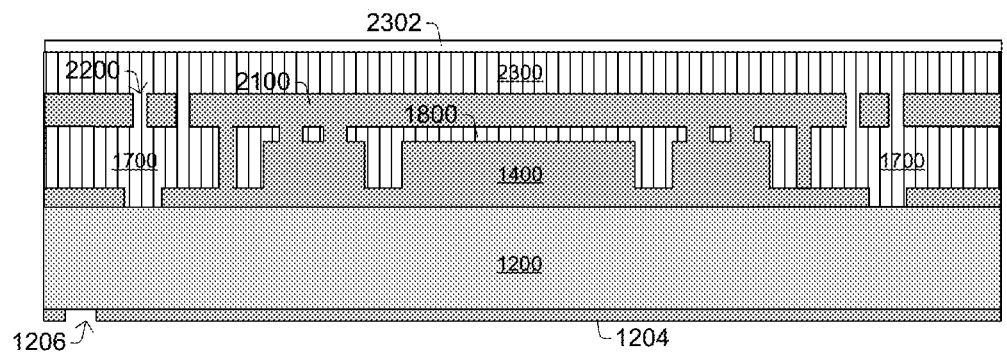

In FIG. 23, another polysilicon layer 2300 is deposited, followed by the formation of a germanium layer 2302. The germanium layer 2302 can be sputtered on in some embodiments. In subsequent processing, the polysilicon layer and germanium layer help to form a conductive, hermetic seal with another surface (e.g., another wafer).

Figure 24:
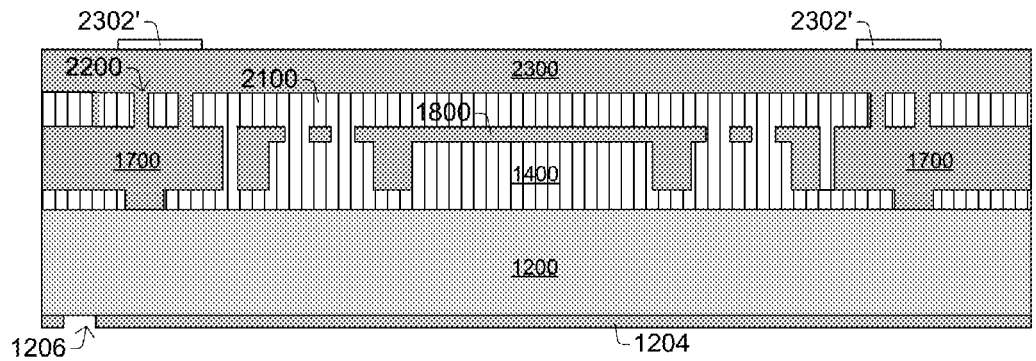
Figure 25:
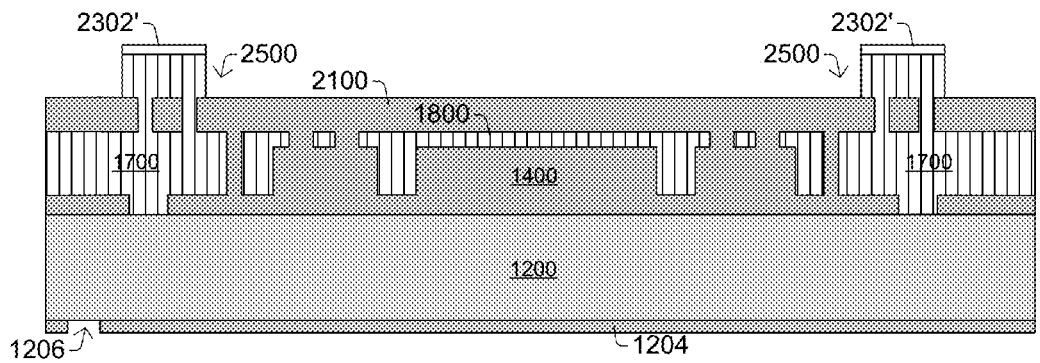

In FIG. 24, the germanium layer is patterned to form a germanium pad 2302', and in FIG. 25 the polysilicon underlying the germanium pad is patterned and etched to form conductive standoff members 2500 that protrude outwardly beyond a surface of the MEMS substrate.

Figure 26:
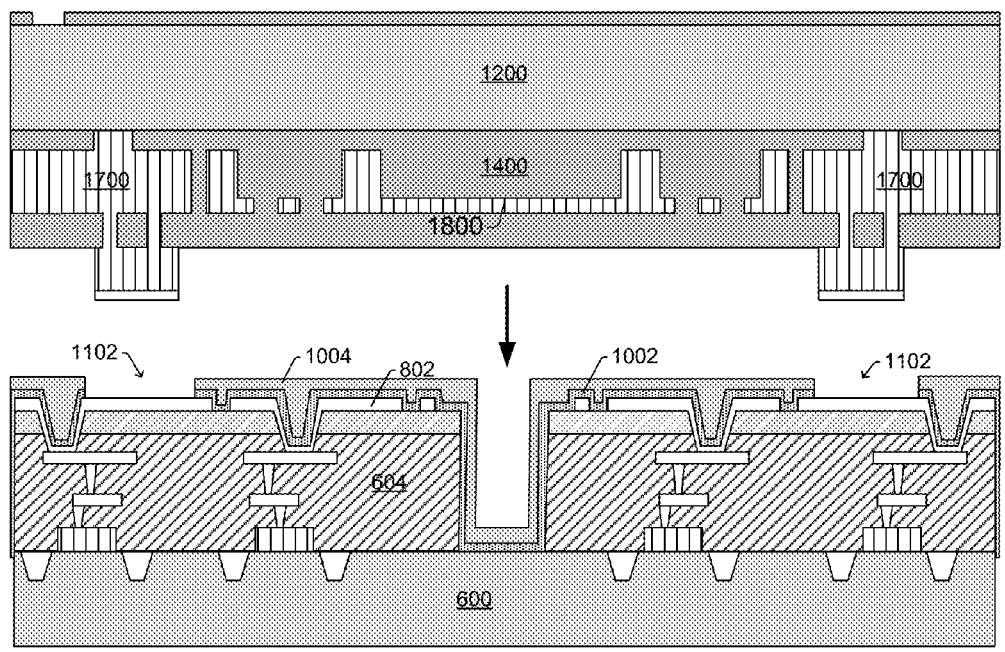
Figure 27:
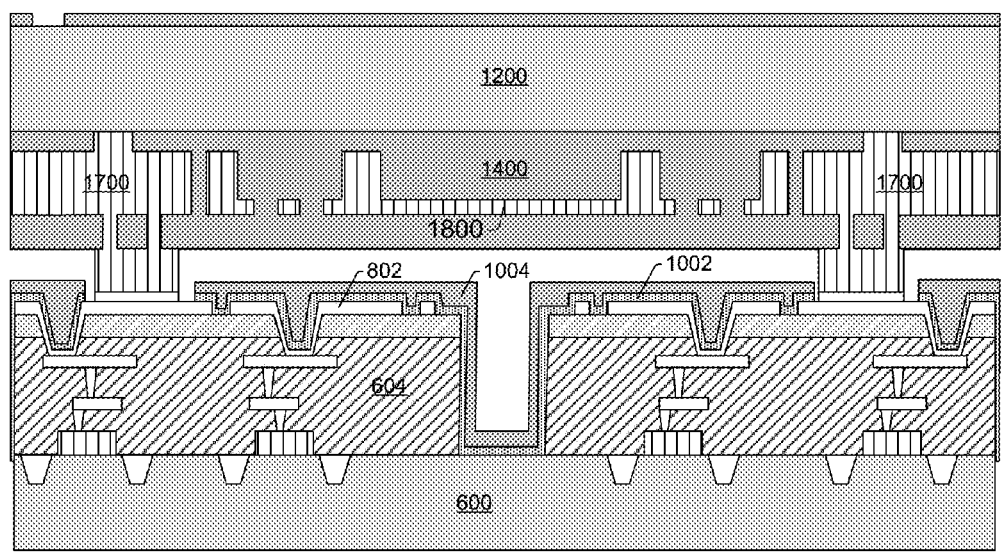

In FIG. 26, the IC and MEMS wafers (structures from FIG. 11 and from FIG. 25, respectively) are bonded. This bonding occurs when a conductive bonding material in the recess is used to position the first substrate proximate to the second substrate and to electrically couple the MEMS structure to the CMOS device. For example, in some embodiments a eutectic alloy can be formed in the recess by sputtering, dual source evaporation or electroplating. Eutectic alloys also can be formed by diffusion reactions of pure materials and subsequently melting of the eutectic composition. When used, eutectic bonding is able to produce hermetically sealed packages and electrical interconnection within a single process. In addition, eutectic bonding provides conductive conducts at low processing temperatures, induces low stress in final assembly, and provides high strength bonds with good reliability. FIG. 27 shows the wafers after they are bonded together.

Figure 28:
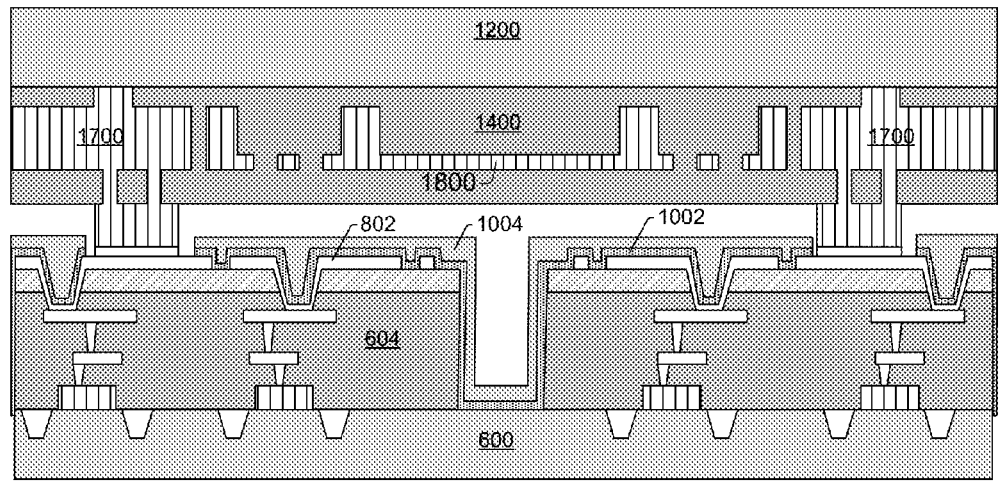

In FIG. 28, the upper surface of MEMS wafer and lower surface of IC wafer are thinned down, for example by CMP or by wafer grinding.

Figure 29:
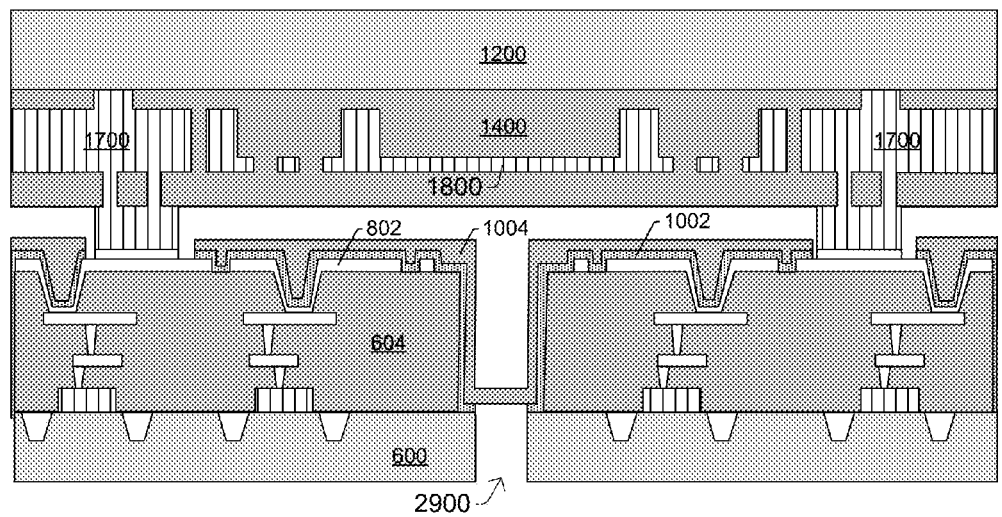

In FIG. 29, a mask is formed over the lower surface of the IC wafer, and an etch, for example in the form of a dry reactive ion etch (DRIE), is carried out to form an IC opening 2900.

Figure 30:
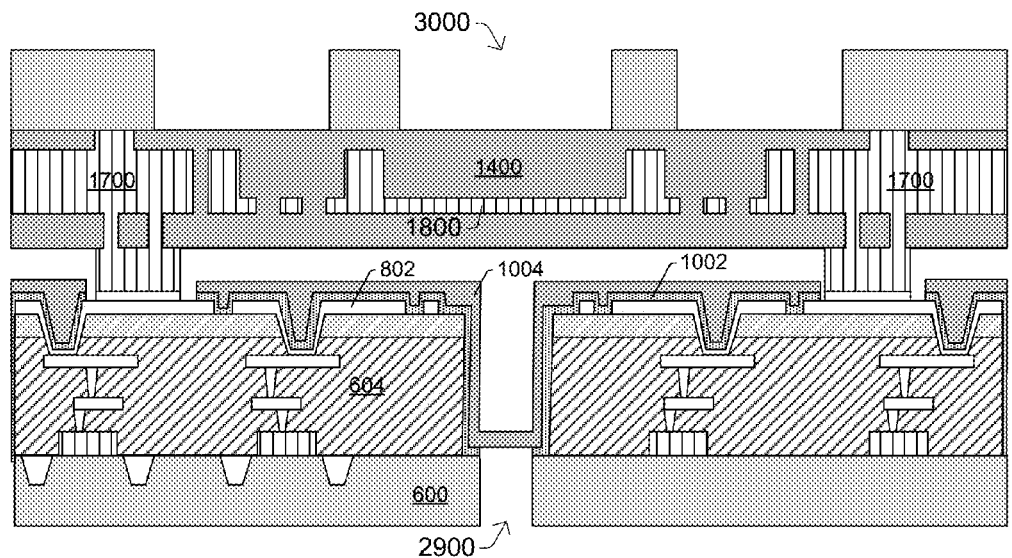

In FIG. 30, a mask is formed over the upper surface of the MEMS wafer, and an etch, for example in the form of a dry reactive ion etch (DRIE), is carried out to form an MEMS opening 3000.

Figure 31:
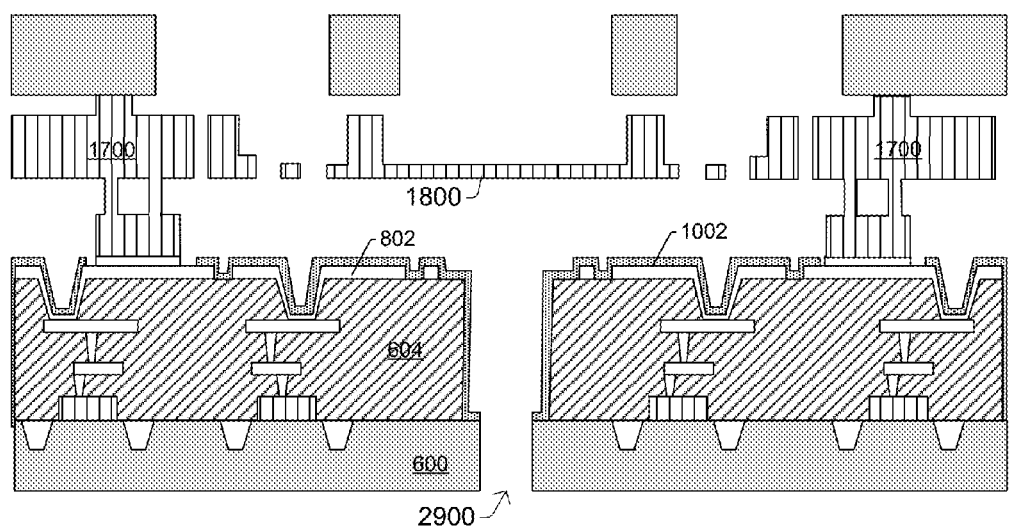

In FIG. 31, a vapor hydro-fluoric etch is performed to release the conductive membrane from its surrounding oxide/protective layer. Thus, the conductive membrane can be exposed to ambient environmental conditions from an upper direction and a lower direction after the vHF etch is performed. The IC wafer and MEMS wafer are often subsequently singulated (i.e., diced) into separate dies, each of which is a stack MEMS substrate and IC substrate, as previously illustrated and described in FIG. 1, for example.

Thus, as can be appreciated from above, some embodiments of the present disclosure provide an integrated circuit (IC) structure. The IC structure includes an IC substrate including active devices which are coupled together through a conductive interconnect structure arranged thereover. The conductive interconnect structure includes a series of horizontal conductive layers and dielectric regions arranged between neighboring horizontal conductive layers. The conductive interconnect structure includes an uppermost conductive horizontal region with a planar top surface region. A MEMS substrate is arranged over the IC substrate and includes a flexible or moveable structure that flexes or moves commensurate with a force applied to the flexible or moveable structure. The active devices of the IC substrate are arranged to establish analysis circuitry to facilitate electrical measurement of a capacitance between the uppermost conductive horizontal region and the flexible or moveable structure.

Other embodiments of the present disclosure provide an integrated circuit (IC) structure made up of an IC substrate and a MEMS substrate. The IC substrate includes active devices which are coupled together through a conductive interconnect structure arranged thereover. The conductive interconnect structure includes a series of horizontal conductive layers and a dielectric region arranged between neighboring horizontal conductive layers. The conductive interconnect structure includes an uppermost planar conductive region corresponding to a lower capacitor electrode. The MEMS substrate is arranged over the IC substrate and includes a flexible or moveable upper capacitor electrode. A bonding ring corresponds to the uppermost planar conductive region of the IC substrate and circumscribes the lower capacitor plate. An IC opening extends vertically through the IC substrate and puts an ambient environment in fluid communication with a lower side of the flexible or movable structure of the MEMS substrate. An IC opening extends vertically through the IC substrate and puts an ambient environment in fluid communication with a lower side of the flexible or movable structure of the MEMS substrate. A MEMS opening extends through the MEMS substrate and puts the ambient environment in fluid communication with an upper side of the flexible or moveable structure of the MEMS substrate.

Still other embodiments relate to a method for manufacturing a microelectromechanical systems (MEMS) device. In this method, a silicon substrate, which includes a plurality of active devices thereon which are coupled together by an interconnect structure arranged thereover, is provided. The interconnect structure has an uppermost conductive layer. A conformal vapor hydrofluoric acid (VHF) barrier is arranged over the uppermost conductive layer, and a first protective oxide is arranged over the conformal VHF barrier. A MEMS substrate is bonded to the silicon substrate by bonding a standoff member to a planar region of the uppermost conductive layer. The MEMS substrate includes a flexible or moveable structure that is embedded in a second protective oxide. An etching process is carried out to remove the first protective oxide to expose an upper surface of the conformal VHF barrier and to free the flexible or moveable structure from the second protective oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
   an integrated circuit (IC) substrate including active devices which are coupled together through a conductive interconnect structure arranged thereover, wherein the conductive interconnect structure includes a series of horizontal conductive layers and dielectric regions arranged between neighboring horizontal conductive layers, and wherein the conductive interconnect structure includes an uppermost conductive horizontal region with a planar top surface region;
   a vapor hydrofluoric acid (VHF) barrier abutting the uppermost conductive layer, and having an upper VHF barrier surface exposed to the ambient environment by way of an opening;
   a MEMS substrate arranged over the IC substrate and including a flexible or moveable structure that flexes or moves commensurate with a force applied to the flexible or moveable structure; and
   analysis circuitry disposed on the IC substrate and configured to provide a pre-determined charge to the flexible or moveable structure and measure a corresponding change in voltage to measure a capacitance between the uppermost conductive horizontal region and the flexible or moveable structure.

2. The IC structure of claim 1, wherein the MEMs substrate further comprises:
   a conductive standoff member which protrudes outwardly from a plane in which the flexible or movable structure is arranged; and
   a germanium bonding material which is arranged at an end of the conductive standoff member and which is bonded to the planar top surface region of the uppermost conductive horizontal region.

3. The integrated circuit structure of claim 2, wherein the planar top surface region is circumscribed by a bond ring and the conductive standoff member.

4. The integrated circuit structure of claim 3, further comprising:
   an IC opening extending vertically through the IC substrate and putting an ambient environment in fluid communication with a lower side of the flexible or movable structure.

5. The integrated circuit structure of claim 4, further comprising:
   a MEMS opening extending at least partially through the MEMS substrate and putting the ambient environment in fluid communication with an upper side of the flexible or moveable structure;
   wherein the analysis circuitry measures a capacitance between uppermost conductive horizontal region and the flexible or moveable structure.

6. The IC structure of claim 1, further comprising:
   a bond ring which extends through an opening in the VHF barrier to physically and electrically couple the MEMS substrate to the planar top surface of the uppermost conductive horizontal region of the IC substrate.

7. The IC structure of claim 1, wherein the IC substrate includes recessed contact areas which surround the planar surface region and which have angled sidewalls.

8. The IC structure of claim 7, wherein the VHF barrier extends downward along the angled sidewalls of the recessed contact areas, and wherein a conductive material extends under the VHF barrier to couple the sensing electrode to a horizontal conductive layer arranged under the uppermost conductive layer.

9. The IC structure of claim 8, further comprising:
   a SiN layer arranged between the uppermost conductive layer and the horizontal conductive layer arranged under the uppermost conductive layer.

10. The IC structure of claim 1, wherein only the VHF barrier layer and a pocket of ambient environment separate the uppermost conductive horizontal region from the flexible or moveable structure.

11. The IC structure of claim 1, wherein the flexible or moveable structure helps implement a microphone device.

12. An integrated circuit (IC) structure, comprising:
an integrated circuit (IC) substrate including active devices which are coupled together through a conductive interconnect structure arranged thereover, wherein the conductive interconnect structure includes a series of horizontal conductive layers and a dielectric region arranged between neighboring horizontal conductive layers, and wherein the conductive interconnect structure includes an uppermost planar conductive region corresponding to a lower capacitor electrode;
a MEMS substrate arranged over the IC substrate and including a flexible or moveable upper capacitor electrode;
a bonding ring corresponding to the uppermost planar conductive region of the IC substrate and circumscribing the lower capacitor electrode;
an IC opening extending vertically through the IC substrate and putting an ambient environment in fluid communication with a lower side of the flexible or movable structure of the MEMS substrate; and
a MEMS opening extending through the MEMS substrate and putting the ambient environment in fluid communication with an upper side of the flexible or moveable structure of the MEMS substrate.

13. The integrated circuit structure of claim 12, wherein the active devices of the IC substrate are arranged to establish analysis circuitry to facilitate electrical measurement of a capacitance between the flexible or moveable structure and the uppermost conductive horizontal layer.

14. The integrated circuit structure of claim 12, wherein the sensing electrode is circumscribed by the bond ring and standoff element.

15. The IC structure of claim 12, further comprising:
a vapor hydrofluoric acid (VHF)-barrier abutting the uppermost conductive layer, and having an upper VHF barrier surface exposed to the ambient environment;
wherein only the VHF barrier layer and a pocket of ambient environment separate the uppermost conductive horizontal region from the flexible or moveable structure.

16. The IC structure of claim 15, wherein the flexible or moveable structure helps implement a microphone device.

17. A method for manufacturing a microelectromechanical systems (MEMS) device, the method comprising:
providing an integrated circuit wafer including a plurality of active devices thereon which are coupled together by an interconnect structure arranged thereover, wherein the interconnect structure has an uppermost conductive layer and wherein a conformal vapor hydrofluoric acid (VHF) barrier is arranged over the uppermost conductive layer and wherein a first protective oxide is arranged over the conformal VHF barrier;
bonding a MEMS wafer to the integrated circuit wafer by bonding a standoff member to a planar region of the uppermost conductive layer, wherein the MEMS substrate includes a flexible or moveable structure that is embedded in a second protective oxide; and
carrying out an etching process to remove the first protective oxide to expose an upper surface of the conformal VHF barrier and to free the flexible or moveable structure from the second protective oxide.

18. The method of claim 17, wherein after the etching process is carried out, only the VHF barrier layer and a pocket of ambient environment remains between the flexible or moveable structure and the uppermost conductive layer.

19. The method of claim 17, further comprising:
singulating the integrated circuit wafer and MEMS wafer into individual die after the etching process has removed the first protective oxide and after the flexible or moveable structure has been freed from the second protective oxide.

20. An integrated circuit (IC) structure, comprising:
an integrated circuit (IC) substrate with an opening extending through the IC substrate, the IC substrate including active devices which are coupled together through a conductive interconnect structure arranged thereover, wherein the conductive interconnect structure includes a series of horizontal conductive layers and dielectric regions arranged between neighboring horizontal conductive layers, and wherein the conductive interconnect structure includes an uppermost conductive horizontal region with a planar top surface region;
a MEMS substrate arranged over the IC substrate and including a flexible or moveable structure that flexes or moves commensurate with a force applied to the flexible or moveable structure; and
a vapor hydrofluoric acid (VHF)-barrier abutting the uppermost conductive layer, and having an upper VHF barrier surface exposed to the ambient environment through the opening in the IC substrate.

21. The IC structure of claim 20, further comprising:
a bond ring which extends through an opening in the VHF-barrier to physically and electrically couple the MEMS substrate to the planar top surface region of the uppermost conductive horizontal region of the IC substrate.

* * * * *